United States Patent [19]
Kroger

[11] 4,220,959
[45] Sep. 2, 1980

[54] JOSEPHSON TUNNEL JUNCTION WITH POLYCRYSTALLINE SILICON, GERMANIUM OR SILICON-GERMANIUM ALLOY TUNNELING BARRIER

[75] Inventor: Harry Kroger, Sudbury, Mass.

[73] Assignee: Sperry Corporation, New York, N.Y.

[21] Appl. No.: 23,487

[22] Filed: Mar. 23, 1979

[51] Int. Cl.$^2$ .............................................. H01L 39/22
[52] U.S. Cl. ........................................ 357/5; 307/306; 29/599
[58] Field of Search ........................... 357/5; 307/306; 324/248; 29/599

[56] References Cited
U.S. PATENT DOCUMENTS
3,702,956 11/1972 Renard .............................. 317/234 R

OTHER PUBLICATIONS

Huang et al., *Appl. Phys. Lett.*, vol. 25, No. 12, Dec. 15, 1974, pp. 753–756.
Laibowitz, *I.B.M. Tech. Discl. Bull.*, vol. 17, No. 6, Nov. 1974, p. 1827.
Holdeman et al., *Appl. Phys. Lett.*, vol. 28, No. 10, May 15, 1976, p. 632 et seq.
Palmer et al., *Appl. Phys. Lett.*, vol. 25, No. 9, Nov. 1, 1974.

*Primary Examiner*—Martin H. Edlow
*Attorney, Agent, or Firm*—Howard P. Terry; Albert B. Cooper

[57] ABSTRACT

A Josephson tunnel junction device having niobium nitride superconductive electrodes includes a polycrystalline semiconductor tunnelling barrier therebetween comprised of silicon, germanium or an alloy thereof preferably deposited on the lower superconductive electrodes by chemical vapor deposition. The barrier height of the junction is precisely controlled by precision doping of the semiconductor material.

27 Claims, 3 Drawing Figures

JOSEPHSON TUNNEL JUNCTION WITH POLYCRYSTALLINE SILICON, GERMANIUM OR SILICON-GERMANIUM ALLOY TUNNELING BARRIER

BACKGROUND OF THE INVENTION

1. Field of the Invention

The invention relates to superconductive circuits particularly with respect to a novel Josephson tunnel junction device therefor. The device may be utilized, for example, in memory and logic circuitry as well as have application as a magnetic field sensor such as in magnetometers and electromagnetic wave detectors and the like.

2. Description of the Prior Art

Superconductive Josephson memory and logic circuits are known in the art which utilize the Josephson tunnel junction as the active switching elements or gates therefor. The Josephson tunnel junction device may also be utilized as a magnetic field sensor such as in magnetometer and electromagnetic wave detector applications. The Josephson junction device comprises two superposed layers of superconductive material with a barrier layer therebetween whereby Josephson tunneling current flows from superconductive layer to the other through the barrier via the Josephson tunneling effect. With the superconductive layers connected into a superconductive loop and control lines disposed adjacent the junction, the d.c. Josephson zero voltage current flowing through the device may be controlled so as to provide the necessary current steering control functions in the Josephson circuitry.

A particular Josephson junction device as well as problems attendant prior art devices are described in U.S. Patent Application Ser. No. 904,051, entitled "Josephson Tunnel Junction Device with Hydrogenated Amorphous Silicon, Germanium or Silicon-Germanium Alloy Tunneling Barrier", filed May 8, 1978 in the name of the present inventor and assigned to the present assignee; said Ser. No. 904,051 is incorporated herein by reference.

As discussed in said Ser. No. 904,051, it is generally desirable for many applications to provide Josephson junction devices that are capable of supporting large critical current densities while utilizing relatively thick barrier layers so as to provide structural rigidity and reliability and to decrease device capacitance. Oxide insulator barrier layers have generally been unsatisfactory in that heretofore only thin and fragile insulator barriers could pass large Josephson d.c. currents, the thin barriers resulting in Josephson devices with undesirably high capacitance.

In an attempt to overcome the prior art disadvantages, semiconductor material has been utilized in constructing Josephson junction devices. For example, the device of said Ser. No. 904,051 utilizes amorphous hydrogenated silicon, germanium or alloys thereof as the barrier material which successfully provides an unusually high current density with a suitably thick barrier. Although as described in said Ser. No. 904,051, the semiconductor barrier may be doped to provide either n-type or p-type semiconductor material for large concentrations of dopant, the fermi level cannot be adjusted from intrinsic to degenerate. At best, the fermi level can be established either near the conduction band or near the valence band. Thus, the properties of the device could only be controlled over a relatively small range of values.

Prior art attempts at utilizing semiconductor barriers in Josephson junction devices have involved attempts at employing randomly selected semiconductors having random uncontrolled properties. Generally there has not been any success in utilizing materials providing precisely controllable properties. Additionally, the semiconductor materials and/or the deposition techniques utilized have largely been experimental and have not drawn on any well developed technology for providing precisely controlled reproducible results with commercially practical uniformity.

On the other hand, in the semiconductor art, the silicon and germanium deposition technology has been developed to a high degree over the past ten to fifteen years so that in this area results having commercial uniformity are routinely achieved. Of all of the semiconductors, silicon and germanium have been the most extensively studied and their properties and behavior are thoroughly understood. Chemical vapor deposition of single crystal and polycrystalline silicon and germanium are commonly utilized in the semiconductor art providing uniform results. For example, utilizing low pressure deposition techniques, films uniform in thickness to within ±1% may be simultaneously deposited over large numbers of silicon wafers. It is known that these semiconductor materials can be precisely and readily doped to provide either n or p-type material with a precisely controlled fermi level from intrinsic to degenerate.

In the Josephson junction device technology to date, it is believed that in the use of crystalline silicon, germanium or alloys thereof only bulk single crystal silicon has been utilized to provide Josephson junction barriers. In order to obtain such barriers, complex etch thinning processes are required to reduce the thickness of the bulk silicon material to thicknesses useable in tunneling barriers. Once such thinning is achieved, patterning and deposition are required on both sides of the silicon wafer in order to provide the tunnel junction structure of superconductor-semiconductor-superconductor. Thus, fabrication techniques necessarily more complex than those utilized for one sided lithographic patterning and deposition are required. Additionally, such etched thinning procedures provide significantly less reproducible thicknesses and properties than does silicon deposition. Because of limitations in the art of etch thinning, the semiconductor barrier material is necessarily limited to p-type degenerative doping thus limiting the properties and utility of the device. Furthermore, the thinning of bulk material to membrance thicknesses whereby Josephson tunneling can occur, results in exceedingly fragile devices.

Typically in Josephson junction devices, it is desirable to provide a large critical current density and a thick barrier. These properties are achievable utilizing heavily doped semiconductor barriers. Generally, doping is desired which achieves degeneracy with the fermi level deeply within the conduction or valence bands. For some applications, however, it may be desirable to control the fermi level to exist at some precise point between the conduction and valence bands. For example, in magnetometer and radiation detector applications, it is necessary to utilize a Josephson junction device with a non-hysteretic characteristic. Since hysteresis is a function of the device critical current, normal state resistance and junction capacitance, it may be necessary to utilize precise fermi level control in order to achieve the proper relationships among these parameters in a particular system. Heretofore precise fermi level control was not achievable in the Josephson junction device technology.

As discussed in said Ser. No. 904,051, it is desirable to utilize refractory superconductive metals in fabricating Josephson junction devices. Generally, non-refractory materials have been utilized in prior art devices. Although the non-refractory superconductive metals such as lead, indium and tin or alloys thereof exhibit suitable superconductive properties, these materials cause difficulties when fabricating superconductive integrated circuits utilizing fine line interconnections. When utilizing standard lithographic processes to produce such circuits, the metal layers tend to move and form hillocks during heating at temperatures greater than 70° C., which temperatures are normally required in performing the printed circuit fabrication operations. Printed circuit fabrication techniques that tend to partially ameliorate the difficulties tend to be more complicated than more conventional fabrication techniques that presently produce high yield integrated circuits of a more conventional variety such as semiconductor circuits. In place of the soft, relatively low melting point superconductive metals mentioned, aluminum has been utilized as the superconductor to alleviate the problem but aluminum has a significantly lower superconductive transition temperature than, for example, lead and therefore requires more energy to refrigerate the devices.

SUMMARY OF THE INVENTION

The above desiderate are achieved and the above prior art disadvantages overcome by a Josephson tunnel junction device comprising first and second layers of superconductive material superposed with respect to each other, the lower one of the layers comprising a refractory compound superconductive metal. A barrier layer is superposed between the first and second superconductive layers whereby Josephson tunneling current can flow therethrough between the superconductive layers, the barrier layer comprising polycrystalline semiconductor material selected from the group consisting of silicon, germanium and alloys thereof. Preferably, the lower superconductive layer is comprised of niobium nitride and the barrier layer is deposited thereon by chemical vapor deposition. The semiconductor barrier layer may be left intrinsic or may be precisely doped to either n or p-type material with the fermi level accurately controlled from intrinsic to degenerate.

DESCRIPTION OF THE PREFERRED EMBODIMENTS

Figure 1:
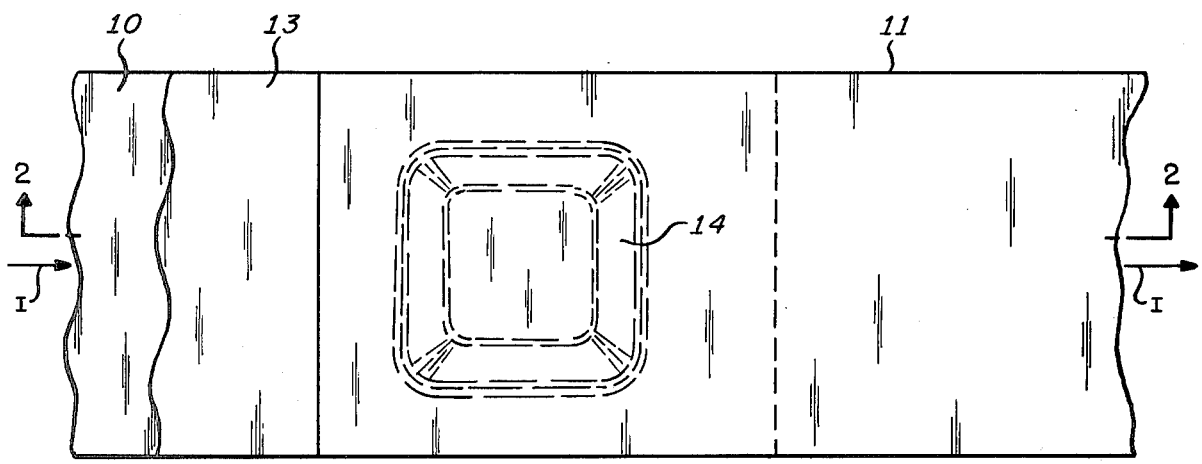
FIG. 1 is a top view of a Josephson tunnel junction device in accordance with the present invention.
Figure 2:
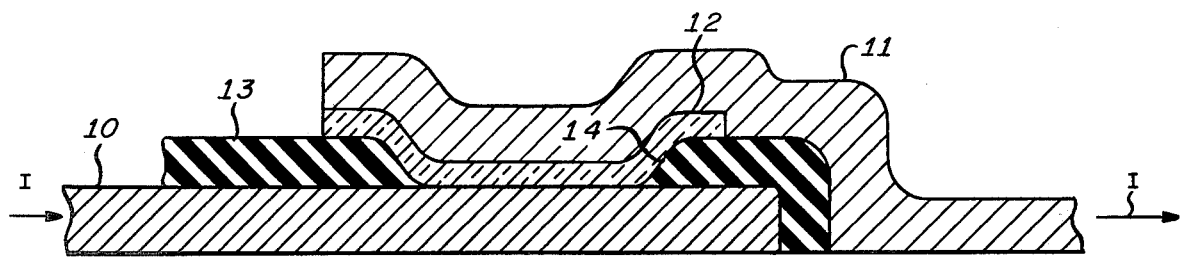
FIG. 2 is a side elevation view of a cross-section of the device of FIG. 1 taken along line 2—2.

Referring to FIGS. 1 and 2, a Josephson tunnel junction device is illustrated, FIG. 1 providing a top view thereof and FIG. 2 providing a cross-sectional view of the device taken along the line 2—2. The tunnel junction device consists of first and second superposed superconductive layers 10 and 11 with a tunnelling barrier 12 therebetween. In accordance with the invention, the tunnelling barrier 12 is comprised of polycrystalline silicon or polycrystalline germanium or a polycrystalline alloy thereof. The barrier material is preferably deposited on the lower superconductive layer 10 by chemical vapor deposition. The barrier layer may be deposited intrinsic or may be doped to either p or n-type material by adding either column III or column V elements respectively during the deposition process. The lower superconductive layer 10 is comprised of a refractory compound superconductive material which is preferably niobium nitride (NbN). A preferred construction of the Josephson junction device includes an insulator layer 13 with an opening 14 therein to define accurately the boundaries of the active tunnelling barrier area of the layer 12. The insulator layer 13 is sufficiently thick to preclude Josephson tunnelling therethrough and is comprised of an insulator material such as, for example, silicon dioxide ($SiO_2$). The opening 14 may, for example, be rectangularly shaped or may have other shapes in accordance with desired device properties. The Josephson junction device may be fabricated with or without the insulator layer 12 with the hole 14 therethrough. The layer 12 defines the tunnelling barrier geometry resulting in enhanced reproducibility of device parameters. The upper superconductive layer 11 may be comprised of niobium nitride or any other suitable superconductor in accordance with the intended application of the device.

As discussed above, it is generally desirable to utilize refractory superconductive materials as the superconductive layers in Josephson junction devices. The refractory metal niobium has been successfully utilized to fabricate a Josephson junction device by sputter depositing hydrogenated amorphous silicon, germanium or a silicon-germanium alloy as the Josephson tunnelling barrier. This device is disclosed in said Ser. No. 904,051. As discussed above, it would be desirable to utilize polycrystalline silicon, polycrystalline germanium or polycrystalline silicon-germanium alloys as the barrier material in such devices. It would also be desirable to utilize chemical vapor deposition to deposit the barrier layer. The art of chemical vapor deposition of these materials has been developed to a high degree in the semiconductor technology. Typically, these materials are chemically vapored deposited at approximately 750° C. using silicon hydride ($SiH_4$) or germanium hydride ($GeH_4$) in a hydrogen-argon carrier gas. Hydrogen is generally released by the pyrolytic decomposition of the silicon or germanium hydride.

These techniques and materials have not heretofore been utilized in the Josephson device technology because the normally utilized non-refractory superconductive materials such as lead, tin, indium or alloys thereof would melt when subjected to the temperatures required for the chemical vapor deposition of polycrystalline silicon, germanium or alloys thereof. The refractory super-conductive metal niobium reacts at the required temperatures with silicon or germanium or hydrogen producing a non-superconductive alloy or niobium and the reacting materials. For example, when utilizing silicon hydride in a carrier gas containing hydrogen, a non-superconductive substance such as niobium silicide might be formed or a non-superconductive alloy of niobium and/or silicon and/or hydrogen. A reaction might also occur between the niobium and the hydrogen produced by the pyrolytic decomposition of the silicon hydride or germanium hydride. Thus, it is appreciated that at temperatures, such as 750° C., required to chemical vapor deposit polycrystalline silicon, germanium or alloys thereof and at concentrations of the hydrogen carrier gas required for the deposition process, niobium is transformed into a non-superconducting alloy of niobium and hydrogen. Furthermore, even at temperatures of 300°–400° C., niobium reacts with silicon and germanium to form non-superconducting alloys.

Thus, prior to the present invention, no superconductive metal, refractory or otherwise, has been used successfully with the chemical vapor deposition of polycrystalline silicon, germanium or alloys thereof in the Josephson junction device technology.

On the other hand, the refractory compound superconductive metal niobium nitride (NbN) does not react with hydrogen at temperatures up to 750° C. in concentrations thereof required to chemical vapor deposit polycrystalline silicon, germanium or alloys thereof. Furthermore, niobium nitride does not react with silicon or germanium or alloys thereof at the temperatures up to 750° C. required for the chemical vapor deposition of these materials at atmospheric pressure. Thus, niobium nitride may be utilized as the superconductive material in Josephson junction devices where polycrystalline silicon, germanium or alloys thereof are to be chemically vapor deposited thereon. It is believed that other compound refractory superconductors such as niobium-tin ($Nb_3Sn$) and niobium-germanium ($Nb_3Ge$) may be utilized to the same effect.

During the chemical vapor deposition of the barrier, the polycrystalline silicon, germanium or alloys thereof may be deposited intrinsic or doped to either p or n-type material by the introduction of column III or column V elements during the deposition process. A suitable source of silicon or germanium is silicon hydride or germanium hydride in a hydrogen-argon carrier gas. By suitable doping, the fermi level of the barrier material may be varied from degeneracy within the valence band to degeneracy within the conduction band and at all levels therebetween. Since the polycrystalline silicon, germanium and alloys thereof can be readily and precisely doped, the properties of the Josephson junction devices utilizing these materials as the tunnelling barrier thereof may be precisely controlled. The wide variation in control of the fermi level permits precise control of the barrier height and thereby of the tunnelling conductance. The semiconductor barriers, because of the lower barrier height with respect to insulators or because of the narrow barriers due to Schottky contacts on degeneratively doped semiconductors, will support large Josephson current densities, a desireratum discussed in said Ser. No. 904,051.

As discussed, p-type doping may be achieved by utilizing column III elements. Preferably, boron is utilized but alternatively aluminum, gallium and indium may also be employed. The n-type doping utilizing column V materials is preferably achieved with phosphorous but arsenic and antimony may also be utilized.

Although chemical vapor deposition is the preferred barrier deposition technique, other processes may alternatively be utilized. For example, the semiconductor layer may be deposited by evaporation or sputtering. If the material is deposited onto a substrate heated to approximately 700° to 750° C., a polycrystalline layer is obtained as desired. If, however, the material is deposited by evaporation or sputtering onto an unheated substrate, an amorphous layer is formed which may be crystallized by thermal annealing, laser annealing, or electron beam annealing or combinations of these processes.

The niobium nitride layers 10 and 11 may be deposited by reactive sputtering of niobium in a partial nitrogen atmosphere onto a substrate heated to approximately 600° C. or alternatively by chemical vapor deposition.

Referring still to FIG. 1, it will be appreciated that in practicing the invention in sensor applications such as magnetometers and electromagnetic wave detectors, the niobium nitride layer 10 which comprises the lower superconductive layer of the device may be deposited on a suitable substrate by a suitable technique such as described above. The barrier layer 12 is then deposited on the lower layer 10 preferably by chemical vapor deposition or by the alternative techniques discussed above. Prior to the deposition of the layer 12, the insulator layer 13 may be deposited to provide precise definition for the active area discussed. In sensor applications, it is then merely necessary to deposit an upper superconductive layer such as the layer 11 to complete the device. In such applications, the upper layer may comprise any suitable superconductive material which preferably would comprise a refractory superconductor for reliable fabrication and utilization. The upper superconductive layer 11 may be niobium nitride.

Figure 3:
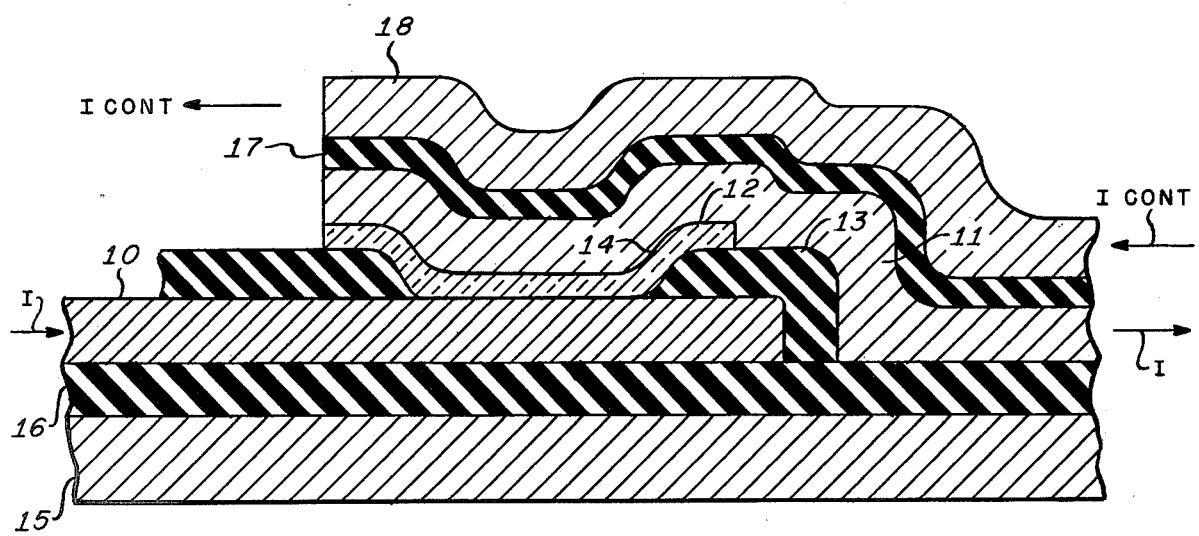
FIG. 3 is a side elevation view of the Josephson tunnel junction of the present invention illustrating further details of an alternative arrangement thereof.

The present invention may also be utilized in Josephson tunnel junction switches in Josephson logic and memory circuitry. Referring to FIG. 3, in which like reference numerals indicate like components with respect to FIG. 2, a cross-sectional elevation view of the Josephson junction device depicting further details thereof in a logic or memory circuit environment is illustrated. As is appreciated in the art, the Josephson tunnel junction device may be utilized as the active switching element in a Josephson logic or memory circuit comprised of microwave strip transmission lines. The circuit, including the active devices, may be fabricated on a superconductive ground plane 15 with an insulator layer 16 deposited thereon. The elements 10–14 are then formed on the insulator layer 16. A further insulator layer 17 is deposited over the superconductive layer 11 and a control line 18 is deposited thereover to provide a control magnetic field for the switching device. Supercurrent I flowing through the lower superconductive layer 10, via tunnelling current through the semiconductor barrier 12 and then through the superconductive layer 11 is controlled by the magnetic field generated by the control current $I_{cont}$ applied to the line 18. The control current provides the switching function of the active device by controlling the Josephson tunnelling current flowing through the barrier 12.

It will be appreciated that the device of the present invention may be fabricated utilizing only refractory superconductors, semiconductors and insulators. For example, all of the superconductive layers 10, 11, 15 and 18 may comprise niobium nitride with the insulator layers 13, 16 and 17 comprising, for example, silicon oxide or silicon dioxide. In accordance with the invention, the barrier layer 12 comprises polycrystalline silicon, germanium or an alloy thereof.

A method that may be utilized in fabricating a superconductive circuit utilizing the present Josephson tunnel junction device as the active switches comprises the following steps:

(1) Depositing niobium nitride ground plane 15 by sputter deposition or chemical vapor deposition 1,000–5,000 Angstrom units thick on an oxided silicon substrate.

(2) Depositing silicon dioxide ($SiO_2$) or amorphous silicon (1,000–20,000 Angstrom units thick) microwave strip transmission line dielectric layer 16 by sputtering.

(3) Utilizing standard photoresistive procedures to pattern and etch the insulator layer 16 to expose the ground plane 15 for effective electrical connections at required points to circuit patterns which will subsequently be deposited.

(4) Depositing 3,000 Angstrom units of niobium nitride by sputter deposition or chemical vapor deposition.

(5) Utilizing standard photoresistive procedures and dry plasma etching or chemical, or sputter etching to pattern the layer of niobium nitride deposited in step 4 to form the desired pattern of lower superconductive circuit islands. This layer of superconductive circuit islands includes superconductive layer 10.

(6) Depositing a layer of silicon dioxide ($SiO_2$) 1,000–5,000 Angstrom units thick by sputtering. This layer includes the insulator layer 13.

(7) Forming the openings 14 by removing the unwanted silicon dioxide by standard photoresistive and etching procedures, the barrier interface on the layer 10 is exposed.

(8) Depositing a layer of polycrystalline silicon or polycrystalline germanium or a polycrystalline alloy thereof 50–1,000 Angstrom units thick by chemical vapor deposition. The semiconductor layer may remain intrinsic or may be doped during this step by the addition of column III or column V dopant gases to the chemical vapor deposition atmosphere. A partial hydrogen carrier gas (approximately 20% hydrogen) should be utilized to activate the dopant. Phosphine doped hydrogen or phosphine doped argon or alternatively, diborane doped hydrogen or diborane doped argon may be utilized. The chemical vapor deposition atmosphere may utilize a carrier gas comprising hydrogen and argon. The layer deposited in this step includes the barrier 12.

(9) Depositing a layer of niobium nitride 3,000 Angstrom units thick by sputtering or chemical vapor deposition. This forms the upper superconductive layer 11.

(10) Removing the unwanted portions of the niobium nitride layer deposited in step 9 by standard photoresistive and etching procedures.

(11) Depositing the insulator layer 17 by sputtering 3,000 Angstrom units of silicon dioxide or evaporating silicon monoxide.

(12) Removing unwanted areas of the insulator layer 17 by standard photoresistive and etching procedures.

(13) Depositing the upper niobium nitride layer forming the control lines 18 by sputter deposition or chemical vapor deposition. The layer deposited in this step can also function to form any required interconnections between the microwave strip transmission lines.

It will be appreciated that when fabricating a Josephson tunnel junction device for utilization as a sensor such as a magnetometer or electromagnetic wave detector, the device illustrated in FIG. 2 would be utilized deposited on a suitable substrate. Thus, the above delineated method would begin with step 4 by depositing the niobium nitride layer on a substrate. Steps 5 through 10 would then be utilized to complete the device. It is appreciated that in such sensor applications, the ground plane and control lines may not be required.

It will be appreciated that the above-described methods are exemplary, other methods being usable to fabricate the superconductive circuits utilizing Josephson tunnel junctions with the novel barrier materials in accordance with the invention as the active switches therefor as well as to fabricate Josephson tunnel junction sensor devices. It will further be appreciated that the above-described materials for fabricating the insulator layers 13, 16 and 17 are exemplary, other suitable insulating materials being usable to the same effect. Although the superconductive layer 10 was described as comprising niobium nitride, it is believed that other compound refractory superconductive materials such as niobium-tin and niobium-germanium may also be utilized. The superconductive layers 11, 15 and 18 may be conveniently fabricated utilizing other refractory superconductive metals such as niobium. If niobium is utilized for any of the layers 11, 15 or 18, d.c. magnetron sputter deposition, electron beam evaporation or r.f. sputter deposition would be the preferred deposition processes therefor.

It will also be appreciated that the dimensions given in the above process for fabricating the logic, memory or sensor devices are exemplary, other dimensions being usable to the same effect. It is expected that the layer 12 deposited in step 8 would typically be hundreds of Angstrom units thick, for example, 500 Angstrom units thick.

It will be appreciated that the doping procedures delineated in step 8 are merely exemplary and are well understood in the semiconductor art. Other conventional doping procedures may be utilized to the same effect. During step 8, the barrier layer 12 comprising polycrystalline silicon or polycrystalline germanium or a polycrystalline alloy thereof may be readily and precisely doped so as to accurately control the fermi level of the barrier as discussed hereinabove.

With respect to the etching steps delineated above, such as step 5, it will be appreciated that niobium nitride is readily and conveniently etched utilizing a dry plasma etch in a precise and repeatable manner. Dry plasma etching may be attained, for example, with an etching gas mixture of tetrafluoromethane ($CF_4$) and oxygen ($O_2$) with the tetrafluoromethane and the oxygen components in approximate percentages of 92% and 8%, respectively. A plasma etcher may be utilized for the procedure. These etching parameters are exemplary and not limiting, other etching materials and procedures being utilizable to the same effect. Although the delineated etching gas causes some undercutting of the niobium nitride layer, an advantage is realized since the gas will also etch underlying silicon layers, thus permitting the desirable removal thereof except where required at Josephson junction barriers. This etching gas will not significantly remove insulator material layers such as silicon dioxide which are utilized to provide crossover insulation or define the active area of the Josephson devices.

It will be appreciated that the devices described above utilize all refractory materials permitting the fabrication of extremely stable superconducting devices, the properties of which will not depend on the number of termperature cycles between room temperature and cryogenic temperatures that the device experiences. This advantage is not provided by the Josephson device technology based on lead, lead alloy or other non-refractory superconductive metals.

It will be appreciated that niobium nitride has a superconducting transition temperature ($T_c$) of approximately 15° Kelvin, which is higher than that of niobium and may therefore provide greater utility in certain applications than devices utilizing niobium. Specifically, niobium nitride may be useful as the superconducting metal in Josephson junction devices where it is desired that the Josephson current density be approximately independent of temperature for cryogenic temperatures below 8° Kelvin. This is a useful property for logic and memory devices and may be necessary for superconducting magnetometer or r.f. detection devices.

Utilizing chemical vapor deposition of polycrystalline silicon, polycrystalline germanium or a polycrystalline alloy thereof permits utilizing the 10–15 years of highly developed silicon and germanium technology in the semiconductor fabrication arts to attain highly uniform films. For example, utilizing low pressure deposition techniques, films uniform in thickness to within ±1% are readily and simultaneously deposited over numerous 3 inch diameter silicon wafers. Such uniformity results in exceedingly reproducible Josephson devices.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. A Josephson tunnel junction device comprising
first and second layers of superconductive material superposed with respect to each other,
at least said first layer comprising a refractory compound superconductive material, and
a barrier layer superposed between said first and second superconductive layers whereby Josephson tunnelling current can flow therethrough between said superconductive layers,
said barrier layer comprised of polycrystalline semiconductor material selected from the group consisting of silicon, germanium and alloys thereof.

2. The device of claim 1 in which at least said first layer of superconductive material comprises niobium nitride.

3. The device of claim 1 in which said barrier layer comprises said polycrystalline semiconductor deposited on said first superconductive layer by chemical vapor deposition.

4. The device of claim 1 in which said barrier layer comprises doped polycrystalline semiconductor material selected from the group consisting of silicon, germanium and alloys thereof.

5. The device of claim 4 in which said barrier layer is doped by a column III material thereby providing p-type semiconductor material.

6. The device of claim 4 in which said barrier layer is doped by a column V material thereby providing n-type semiconductor material.

7. The device of claim 1 in which said barrier layer is deposited on said first superconductive layer by evaporative deposition.

8. The device of claim 1 in which said barrier layer is deposited on said first superconductive layer by sputter deposition.

9. The device of claim 7 or 8 in which said barrier layer comprises said polycrystalline semiconductor material deposited on said first superconductive layer which is so heated that said polycrystalline semiconductor forms thereon.

10. The device of claim 7 or 8 in which said barrier layer comprises said polycrystalline semiconductor material deposited on said first superconductive layer which is at such a temperature that such deposition produces amorphous semiconductor material which is crystallized into said polycrystalline semiconductor material by a technique selected from the group consisting of thermal annealing, laser annealing, electron beam annealing and combinations thereof.

11. The device of claim 2 in which at least said first layer of niobium nitride is deposited by reactive sputtering of niobium in a partial nitrogen atmosphere onto a suitably heated substrate.

12. The device of claim 2 in which at least said first layer of niobium of nitride is deposited onto a substrate by chemical vapor deposition.

13. The device of claim 1 further including an insulator layer disposed between said first and second superconductive layers having at least one opening therethrough for defining the Josephson tunnelling barrier area of said device.

14. The device of claim 5 in which said barrier layer is doped by a dopant selected from the group consisting of boron, aluminum, gallium and indium.

15. The device of claim 6 in which barrier layer is doped by a dopant selected from the group consisting of phosphorous, arsenic and antimony.

16. The device of claim 1 further including control line means proximate said superconductive layers and electrically insulated therefrom for providing a control magnetic field to said barrier layer thereby controlling said Josephson tunnelling current flowing therethrough.

17. The device of claim 16 further including superconductive ground plane means with said first and second superconductive layers superposed between said control line means and said ground plane means.

18. A Josephson tunnel junction device for use as a switch in superconductive circuits comprising:
a superconductive ground plane,
a dielectric layer deposited on said ground plane,
a first layer of refractory compound superconductive material deposited on said dielectric layer,
a first insulator layer deposited on said first superconductive layer with at least one opening therethrough for defining a Josephson tunnelling barrier area,
a barrier layer of polycrystalline semiconductor material deposited on said first insulator layer and into said opening,
said semiconductor material selected from the group consisting of silicon, germanium and alloys thereof,
a second layer of superconductive material deposited on said layer of semiconductor material,
said semiconductor material deposited in said opening forming a Josephson tunnelling barrier between said first and second superconductive layers whereby Josephson tunnelling current can flow therethrough between said superconductive layers, a second insulator layer deposited on said second superconductive layer, and superconductive control line means deposited on said second insulator layer for providing a control magnetic field to said barrier thereby controlling the Josephson tunnelling current flowing between said superconductive layers through said barrier.

19. The device of claim 18 in which said first layer of superconductive material comprises niobium nitride.

20. The device of claim 19 in which said barrier layer comprises said polycrystalline semiconductor material deposited on said first superconductive layer by chemical vapor deposition.

21. The device of claim 20 in which said barrier layer comprises doped polycrystalline semiconductor material selected from the group consisting of silicon, germanium and alloys thereof.

22. A method of manufacturing the device of claim 18 comprising the steps of:

depositing a dielectric layer on a superconductive ground plane, depositing a first layer of refractory compound superconductive material on said dielectric layer, depositing a first insulator layer on said first superconductive layer, forming at least one opening through said first insulator layer, depositing a layer of polycrystalline semiconductor material by chemical vapor deposition on said first insulator layer thereby depositing said polycrystalline semiconductor material in said opening, said semiconductor material selected from the group consisting of silicon, germanium and alloys thereof, depositing a second layer of superconductive material on said layer of semiconductor material, said semiconductor material within said opening forming a Josephson tunnelling barrier between said first and second superconductive layers, depositing a second insulator layer on said second superconductive layer, and depositing superconductive control line means on said second insulator layer.

23. The method of claim 22 further including the step of doping said semiconductor material during said chemical vapor deposition thereof.

24. A method of manufacturing the device of claim 1 comprising the steps of:

depositing a first layer of refractory compound superconductive material on a substrate, depositing an insulator layer on said first superconductive layer, forming at least one opening through said insulator layer, depositing a layer of polycrystalline semiconductor on said first insulator layer by chemical vapor deposition thereby depositing said polycrystalline semiconductor material in said opening, said semiconductor material selected from the group consisting of silicon, germanium and alloys thereof, and depositing a second layer of superconductive material on said layer of semiconductor material, said semiconductor material within said opening forming a Josephson tunnelling barrier between said first and second superconductive layers.

25. The method of claim 22 in which said step of depositing a first layer of refractory compound superconductive material comprises the step of depositing a layer of niobium nitride on said dielectric layer.

26. The method of claim 24 in which said step of depositing a first layer of refractory compound superconductive material comprises the step of depositing a layer of niobium nitride on said substrate.

27. The method of claim 24 further including the step of doping said semiconductor material during said chemical vapor deposition thereof.

* * * * *